United States Patent [19]

Matsumoto et al.

[11] Patent Number: 5,430,303
[45] Date of Patent: Jul. 4, 1995

[54] EXPOSURE APPARATUS

[75] Inventors: Yukako Matsumoto, Kawasaki; Akira Miyaji, Tokyo, both of Japan

[73] Assignee: Nikon Corporation, Tokyo, Japan

[21] Appl. No.: 318,520

[22] Filed: Oct. 5, 1994

Related U.S. Application Data

[63] Continuation of Ser. No. 83,287, Jun. 29, 1993, abandoned.

[30] Foreign Application Priority Data

| Jul. 1, 1992 | [JP] | Japan | 4-174096 |
| Jul. 23, 1992 | [JP] | Japan | 4-195706 |
| Jan. 12, 1993 | [JP] | Japan | 5-002956 |

[51] Int. Cl.$^6$ .......................... H01K 1/26; H01J 37/00
[52] U.S. Cl. .............................. 250/492.2; 250/493.1; 250/492.22
[58] Field of Search .............. 250/492.1, 492.2, 493.1, 250/504 R, 503.1, 492.22

[56] References Cited

U.S. PATENT DOCUMENTS

| 4,665,315 | 5/1987 | Bacchetti | 250/424 |
| 5,146,098 | 9/1992 | Stack | 250/492.3 |
| 5,166,530 | 11/1992 | McCleary | 250/492.2 |
| 5,194,740 | 3/1993 | Kogelschatz et al. | 250/492.1 |

FOREIGN PATENT DOCUMENTS 62-252136 11/1987 Japan.
4-139453 5/1992 Japan.

Primary Examiner—Jack I. Berman
Assistant Examiner—James Beyer
Attorney, Agent, or Firm—Shapiro and Shapiro

[57] ABSTRACT

An exposure apparatus comprises a light source emitting light of the ultraviolet region; an illuminating system for introducing the light from the light source into a mask bearing a predetermined pattern; an exposure unit for forming the image of the mask pattern on a photosensitive substrate; a chamber accommodating the light source, the illuminating system and the exposure unit; and an impurity eliminating device for eliminating at least an organic impurity inducing a photochemical reaction with the light of the ultraviolet region.

22 Claims, 10 Drawing Sheets

EXPOSURE APPARATUS

This is a continuation of application Ser. No. 08/083,287 filed Jun. 29, 1993, now abandoned.

BACKGROUND OF THE INVENTION

1. Field of the Invention

The present invention relates to an exposure apparatus, and more particularly an exposure apparatus provided with a light source emitting light of ultraviolet region, such as an excimer laser, a harmonic wave laser or a mercury lamp.

2. Related Background Art

Recent advancement of the semiconductor integrated circuits in the level of integration is requiring submicron formation of the minimum circuit geometry. One of the means for achieving such miniaturization is the reduction of wavelength of the light source for the projection exposure apparatus, employed for the preparation of the semiconductor integrated circuits. Currently conceived candidates of such short wavelength light source for the projection exposure apparatus are, for example, a wavelength of 248 nm of the KrF excimer laser, 193 nm of ArF excimer laser or a harmonic wave of Ti-sapphire laser, 266 nm of the 4-times harmonic wave of YAG laser and 213 nm of the 5-times harmonic wave of YAG laser.

Figure 11:
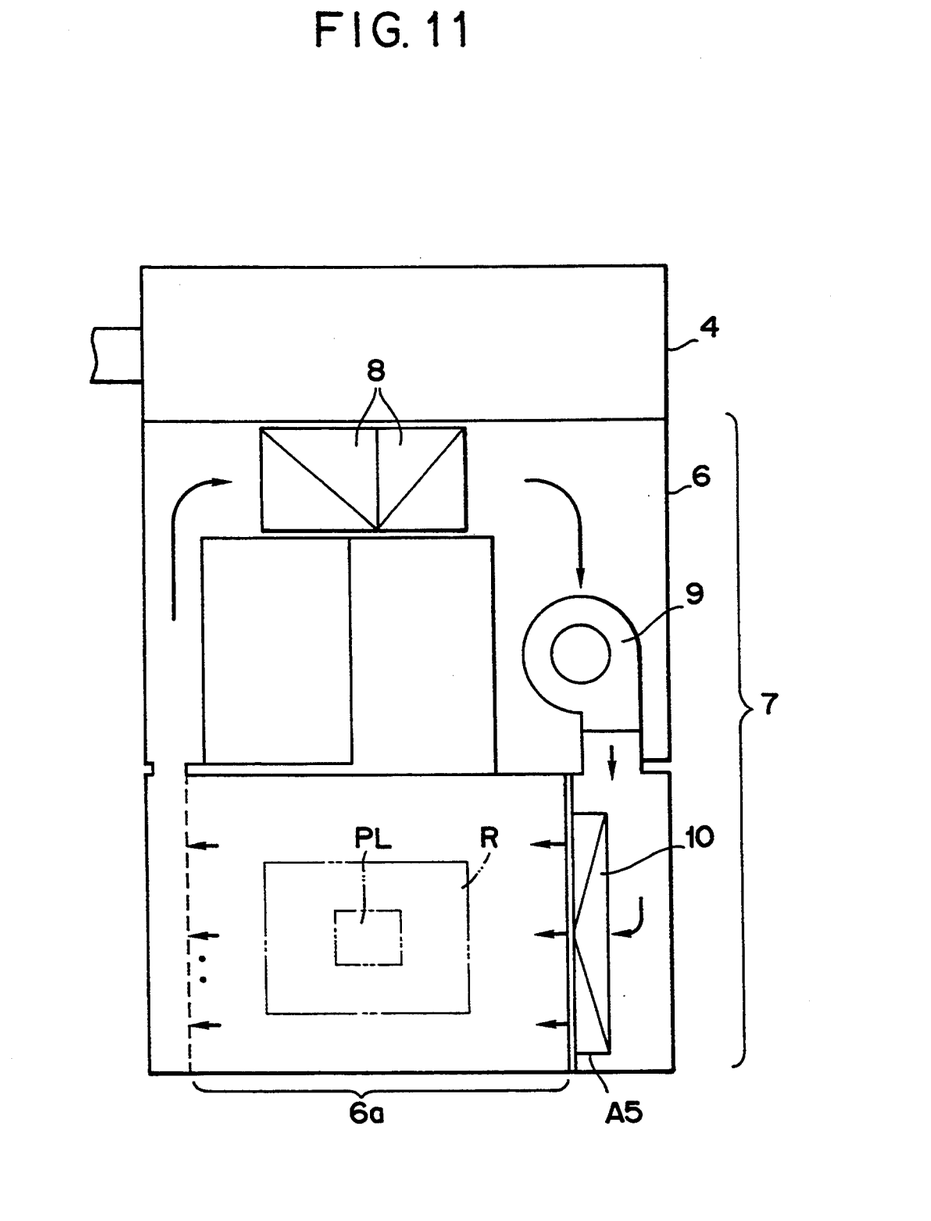
FIG. 11 is a schematic view of a conventional exposure apparatus.

FIG. 11 is a schematic plan view of such laser exposure apparatus. The light from an unrepresented light source illuminates a mask of a reticle R formed with a circuit pattern through an illuminating system unit 4, thereby transferring said circuit pattern onto a photosensitive substrate (wafer). Said mask and wafer are positioned respectively on two stages provided in a chamber 6, in which an air conditioning system 7 is provided for maintaining constant ambient conditions in said chamber. For this purpose the air conditioning system 7 circulates air, of which temperature is controlled by a temperature regulator 8, within the system at a constant velocity by a fan 9. At the air inlet to the main body 6a, there is provided a HEPA (high efficiency particulate air) filter 10 for preventing intrusion of particles into the main body 6a, thereby maintaining the cleanness therein at a certain level.

The formation of semiconductor patterns with exposure apparatus utilizing a light source of a long wavelength such as of g- or i-ray has been conducted by an already established process of exposure and development of so-called novolac type photoresist (photosensitive resin) consisting of a novolac resin and a sensitizer. However, when the light source wavelength is reduced for example to 248 nm of the excimer laser, such novolac type photoresists cannot provide a pattern of satisfactory profile because of the increased light absorption of the resin. Consequently, for the exposure apparatus utilizing the light of shorter wavelength such as of the excimer laser, there has been introduced a new family of photoresists called chemical amplification type, which has become predominant at present, because of the superior performances such as pattern profile, resolving power and sensitivity. The chemical amplification photoresist is generally composed of a resin, a photosensitive acid generator and a dissolution accelerator or a crosslinking agent. The acid generator generates an acid at the exposure, then said acid functions as a catalyst at the postexposure bake (PEB) to accelerate the reaction of the dissolution accelerator or the crosslinking agent, and the pattern is formed at the development. A positive- or negative-working pattern is formed respectively by the use of the dissolution accelerator or the crosslinking agent.

The above-mentioned apparatus utilizes various optical system, including the illuminating system 4, lenses (such as relay lenses and a projection lens PL) and mirrors, and the optical materials constituting such optical systems become hazy by the irradiation of the light of ultraviolet region, thus losing transmittance. For this reason the conventional apparatus has been associated with a drawback of a decrease of the ultraviolet irradiation reaching the wafer surface.

Such gradual decrease of transmittance of the optical materials has conventionally been coped with by the cleaning or replacement of the smeared optical materials. However, such cleaning or replacement inevitably involves a movement of the optical system, and necessitates therefore the adjustment of the optical axis etc. During such adjustment the apparatus is not operable, so that a long down time is therefore unavoidable.

Figure 4A:
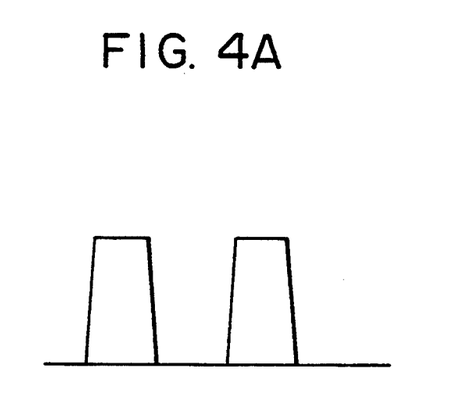
FIG. 4A is a view of a photoresist pattern obtained with novolac type photoresist.
Figure 4B:
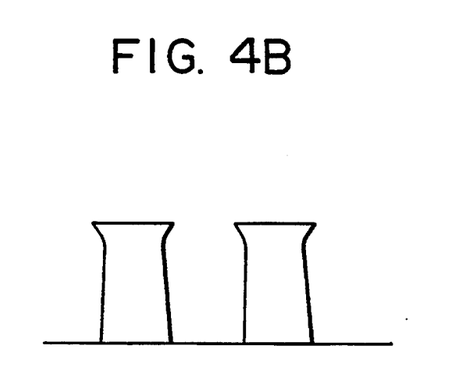
FIG. 4B is a view of a photoresist pattern obtained when chemical amplification photoresist is used in an atmosphere containing basic gas.

Also the chemical amplification photoresists, employed for such ultraviolet exposure apparatus, are superior in the resolving power and the sensitivity, but lack stability, because of the difficulty in the control of acid generation by exposure and of acid catalyst function by postexposure bake. Particularly in the positive working photoresists, if basic gas such as amine is present in the atmosphere from the exposure to the postexposure bake, the acid generated by the exposure in the vicinity of the photoresist surface escapes into the air by reaction with such basic gas, thus causing surface insolubilizing phenomenon, in which the exposed area, to be dissolved in the developer, becomes insoluble. FIG. 4A shows a rectangular photoresist profile, obtained with novolac type photoresist, and with an exposure apparatus utilizing an exposure wavelength of g- or i-ray. If a similar pattern is formed with a positive-working chemical amplification photoresist, the obtained profile becomes T-shaped with a cusp at the top as shown in FIG. 4B, if such insolubilized layer is formed. Such T-shaped profile significantly hinders the succeeding steps such as etching, rendering faithful reproduction of the pattern impossible. Such basic gas is often present in the air of the clean room, thus hindering the use of the chemical amplification photoresists.

Also the conventional apparatus is incapable of eliminating the cause of smear, present in the apparatus.

SUMMARY OF THE INVENTION

In consideration of such drawbacks in the prior art, an object of the present invention is to eliminate impurities (ions, gasses, organic substances etc.) giving rise to obstacles at the exposure, such as the loss in the illumination intensity caused by the haze in the optical materials and the surface insolubilization of the chemical amplification photoresists.

Another object of the present invention is to propose a system configuration capable of reducing the smear deposition onto the optical materials, thereby preventing such smear deposition.

Still another object of the present invention is to eliminate the cause of smear present in the apparatus.

The above-mentioned haze on the optical materials is caused by the deposition of a certain substance (impurity) thereon, and the analyses by ion chromatography have identified said substance as $(NH_4)_2SO_4$ (ammonium sulfate) in most cases.

Also the ESCA and SEM analyses have revealed that the haze on the optical elements is sometimes caused by the deposition of silicon oxide ($SiO_x$) on the lenses or mirrors. Such silicon oxide deposition on the optical element causes light scattering, if the surface of silicon oxide is not smooth. Even when such silicon oxide has a smooth surface, if it is deposited on an antireflective film or a highly reflective film provided on the optical element, the condition for antireflection or high reflection is no longer satisfied, so that the transmittance or reflectance is lowered, whereby the illumination intensity is eventually reduced.

Such impurity deposition is presumably caused by photochemical deposition, in the area irradiated by the ultraviolet light, of ammonium ions $NH_4^+$ and sulfate ions $SO_4^{2-}$, or organic silanol. Such ions or compound molecules have been considered to be generated from the surface of the supporting members and the shield members in the illuminating system, or to be present in the air, or to be ionized by the ultraviolet light irradiation.

Black almite (BAm) is often used in the supporting members and the shield members in the illuminating systemic. Since black almite utilizes diazo dyes and employs sulfuric acid in the processing step therefor, the supporting members and the shield members of the illuminating system can be the sources of ammonium ions and sulfate ions constituting ammonium sulfate.

Results of measurements of the smear on the optical materials with the ultraviolet irradiation on the black almite in $N_2$ atmosphere, $O_2$ atmosphere and ordinary air atmosphere rich in water vapor indicate that the generation of ammonium and sulfate ions is highest in the air atmosphere rich in water vapor, and then in the $O_2$ atmosphere, suggesting a possibility of smear acceleration by the presence of water in the air.

Also ultraviolet irradiation on $O_2$ will generate reactive or activated ozone, which may accelerate ion generation from the wall of the supporting member etc. or ionization of gasses in the air. However the source of silicon oxide could not be found in the apparatus.

On the other hand, the investigation on the correlation between the smear of the apparatus and the ambient conditions of the location of installation has revealed that the clean room often contains the ionic substances such as ammonium ions, sulfate ions and nitrate ions. Also organic silanes such as HMDS (hexamethyl disilazane) or trimethyl silanol were found in certain locations. HMDS is frequently used for surface treatment at the coating of the photosensitive material on the wafer, and trimethyl silanol is generated, together with ammonia, by hydrolysis of HMDS. As a result of the investigation, an extremely high correlation was found between the amounts of the haze substances (($NH_4)_2SO_4$, $SiO_x$) and of the above-mentioned impurities (ammonium ions, sulfate ions, nitrate ions and other ionic substances; organic silanes) contained in the ambient atmosphere.

Such detailed investigation of the status of smear of the optical materials has revealed that the source of such smearing substances is mostly not the materials present in the apparatus (illuminating or exposing systems) but is present in the ambience in which the apparatus is installed. The HEPA filter has been used for air conditioning of such apparatus, but, being designed to eliminate particles, the HEPA filter is unable to eliminate such impurities such as the ions or organic silanes inducing the photochemical reactions.

The Japanese Patent Laid-Open Application No. 4-139453 discloses an exposure apparatus equipped with optical members for condensing the light from a light source emitting the exposing light or guiding said light into a predetermined direction, a container containing said light source and said optical members, and ion particle eliminating means for eliminating the ion particles contained in the gas introduced into said container. However, the cause of the smear is not limited to the ion particles, and such apparatus is unable to remove the smearing substances that remain in the apparatus or are generated therein, even though the amount of such generation may be limited. Consequently such apparatus has been unable to completely prevent the hazing of the optical systems. For example, as explained before, HMDS is decomposed by hydrolysis into trimethylsilanol and ammonia. The ion particle eliminating means alone, disclosed in said Japanese Patent Laid-open Application No. 4-139453, is unable to remove the organic molecules such as HMDS, and is not necessarily effective if HMDS is passed by said eliminating means and is then hydrolyzed to ammonia.

The foregoing drawbacks are resolved, according to the present invention, by an exposure apparatus comprising:

a light source for emitting light of the ultraviolet region;

an illuminating system for introducing the light, from said light source, into a mask bearing a predetermined pattern;

an exposure unit for forming the image of the pattern of said mask on a photosensitive substrate;

a chamber accommodating said light source, said illuminating system and said exposure unit;

air conditioning means for effecting the air conditioning in said chamber by circulating gas therein; and a filter for eliminating an impurity inducing a photochemical reaction by the light of the ultraviolet region;

wherein said filter is provided at least at one of the air inlet of said air conditioning means, the air outlet of said air conditioning means and the air inlet of said chamber.

An ion absorbing filter composed for example of ion exchange fibers or an impurity absorbing filter containing active carbon or zeolite, provided at the air inlet, can prevent intrusion of the above-mentioned ions or gasses, or the impurity such as organic silanol, present in the air. Since air is circulated for air conditioning within the chamber of the main body, the ions or gasses or impurities such as organic silanol can be effectively absorbed, by placing such filter in an air path, for example at the exit of the temperature regulator, behind the air circulating fan or in front of the HEPA filter, whereby the ions or impurity molecules such as of organic silanol can be reduced in the air of the chamber. Also in a system lacking particular air circulation, such as the illuminating system, the provision of a filter in a position of possible air flow prevents the intrusion of impurities such as ions, gasses or organic silanol, beyond the initial level of these substances eventually present in such system. Also since the illuminating system can be easily separated from the external air, the new entry of external air can be prevented by constructing said system closed and supplying gas different from the ambient atmosphere of the apparatus, such as nitrogen.

It is thus rendered possible to reduce the smear of the optical systems by the removal of the impurities such as ions, gasses and organic silanol, present in the air.

Also the absorption of basic gasses such as amines by the above-mentioned filter reduces the reaction between the photoresist and such gasses at the exposure operation, thereby suppressing the surface insolubilizing phenomenon of the positive-working chemical amplification photoresists.

According to the present invention, as explained in the foregoing, there is provided a filter capable of eliminating the impurities such as ions, gasses and organic substances in the laser exposure apparatus, in order to prevent the loss in illuminating intensity, resulting from the smear on the optical materials. Also the basic gas is removed to reduce surface insolubilizing phenomenon of the chemical amplification photoresist, thereby enabling the exposure with a higher resolving power.

Also according to another embodiment of the present invention, there is provided an exposure apparatus comprising:

a light source emitting light of the ultraviolet region;

an illuminating system for introducing the light from said light source into a mask bearing a predetermined pattern;

an exposure unit for forming the image of the pattern of said mask on a photosensitive substrate;

a shield unit for shielding the illuminating system and the exposure unit from the light of the ultraviolet region; and a dielectric member for absorbing impurity inducing a photochemical reaction with the light of the ultraviolet region;

wherein said dielectric member is provided on the wall of said shield unit.

In the ultraviolet exposure apparatus, the wall of the shield unit is mainly composed metal materials, which generate scattering substances by the irradiation with the ultraviolet light. Also the irradiation with the direct or scattered ultraviolet light on the shield unit induces electron liberation by the photoelectric effect, thus eventually causing ionizing of small particles or gas present in the vicinity of the metal surface. As the wall of such shield unit is conductive, the ionized particles or gas, that may cause smear on the optical materials, is little deposited on such wall. Thus, if the metal surface is covered with a dielectric material, there can be prevented the scattering of the surfacial material from the shield unit or the ionization of particles resulting from the electron liberation, and the ionized particles can be absorbed on said covering. Consequently it is rendered possible to prevent the smear of the optical materials.

Further, if said dielectric member is composed of an easily chargeable material such as a plastic material, it is not only possible to prevent the scattering of the surfacial material from the shield unit and the ionization of particles resulting from electron liberation, but also to more efficiently absorb the ionized particles, thereby improving the effect of prevention of smear on the optical materials.

According to the present invention, as explained in the foregoing, the use of a dielectric member on the metal surface of the shield unit for the illuminating optical system can prevent the ionization of small particles by the electrons liberated from the shield unit, thereby reducing the smear of the optical members. Also the wall of said shield unit is charged by the direct or scattered ultraviolet light to induce deposition of the particles on said wall, whereby the smear of the optical materials is further reduced.

DETAILED DESCRIPTION OF THE PREFERRED EMBODIMENTS

Figure 1:
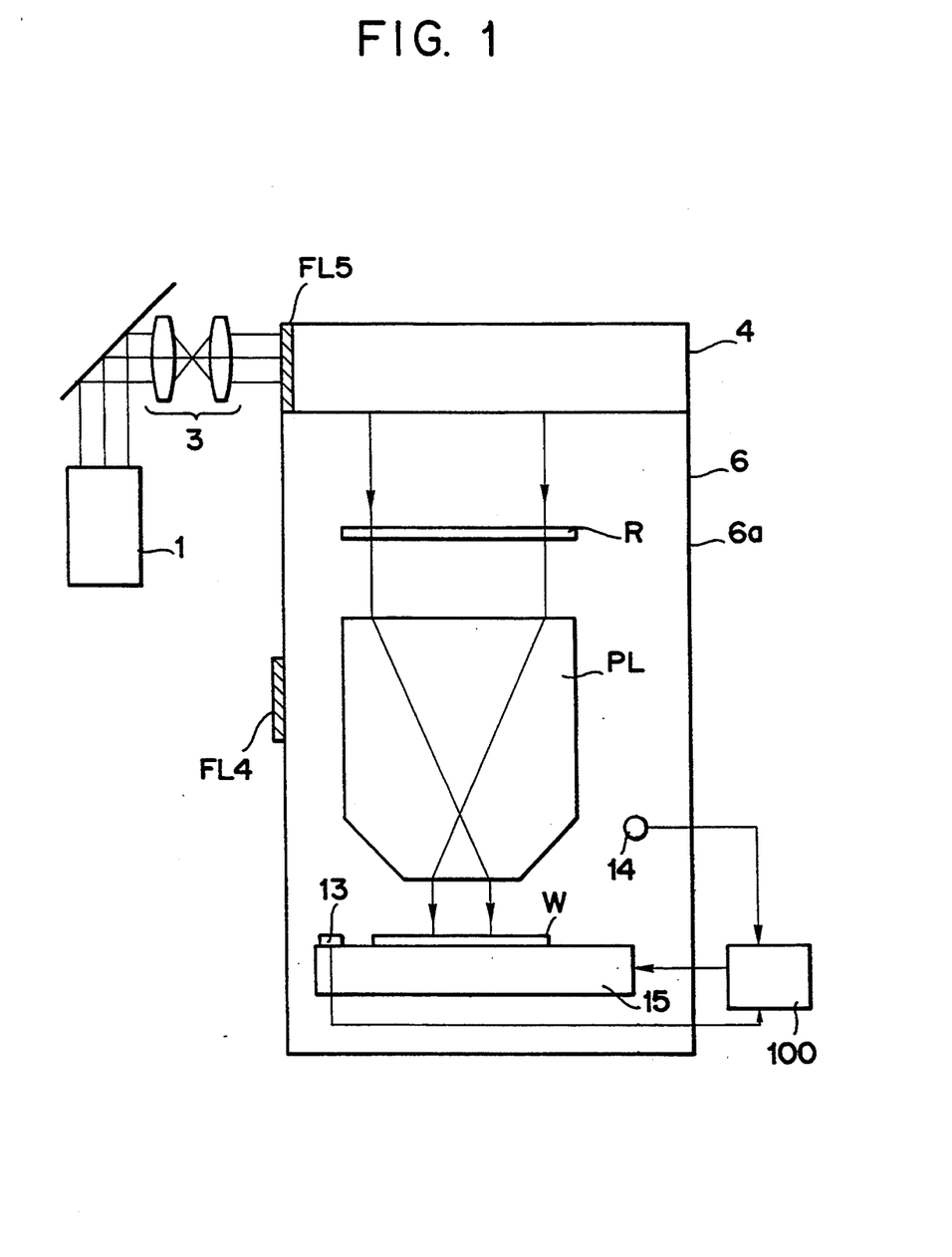
FIG. 1 is a schematic view of an exposure apparatus constituting a first embodiment of the present invention.

Now there will be explained a first embodiment of the present invention, with reference to the attached drawings. FIG. 1 is a schematic view of an exposure apparatus employing a laser light source, wherein components equivalent to those in FIG. 11 are represented by same symbols.

An excimer laser beam (hereinafter called UV light beam) emitted from a light source 1, consisting for example of a KrF or ArF excimer laser is shaped into a necessary shape and a size by an unrepresented beam shaping system, then guided through a relay lens 3, and is introduced into an illuminating system 4, which is provided with means for obtaining a uniform illumination intensity composed for example of an optical integrator such as fly's eye lenses and a condenser lens, and also with various lenses and mirrors. The light from said illuminating system 4 enters a mask R bearing a predetermined pattern, thereby forming the image of the mask pattern, through a projection optical system (refractive, reflective or refractive-reflective) PL, on a wafer W placed on an XY-stage 15. In the present embodiment, the wafer W is assumed to be coated with chemical amplification photosensitive material.

The projection optical system PL, the wafer W, the XY-stage 15 and an unrepresented stage driving system are accommodated in a chamber 6a of the main body. Said chamber 6a maintains the main body of the apparatus at constant ambient conditions (cleanness, temperature, pressure, humidity etc.). On the XY-stage 15 there is provided an illumination intensity monitor 13, the surface of which is substantially coplanar with the surface of the wafer W. In the chamber 6a there is provided an ion sensor 14 for monitoring the ion concentration, ion polarity and basic gas concentration therein. The information from said illumination intensity monitor 13 and the ion sensor 14 is supplied to a main control system 100 and used for the function of the exposure apparatus. Said main control system 100 controls not only the XY-stage 15 but also the entire apparatus.

Filters FL for eliminating the impurities such as ions, gasses, organic silanol etc. (hereinafter called the impurity eliminating filters FL) are provided at an external air inlet A2 of the chamber 6a, an external air inlet A1 of the illuminating system 4, and in an air circulating path of an air conditioning system 7 (FIG. 2).

Figure 2:
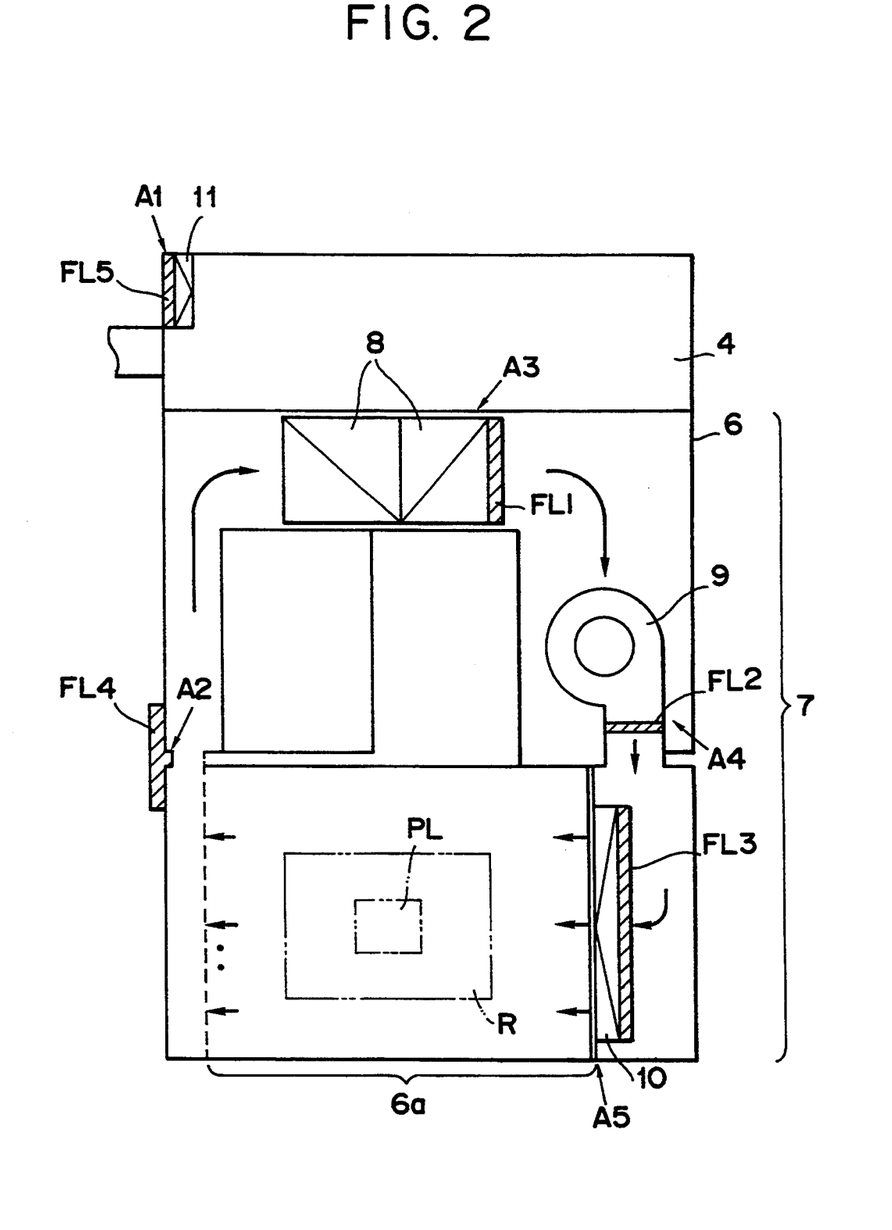
FIG. 2 is a schematic plan view of the apparatus shown in FIG. 1.

FIG. 2 is a partial plan view of the exposure apparatus shown in FIG. 1. In the present embodiment, a main body chamber 6a including the main body of the exposure apparatus, an air conditioning system 7 and an illuminating system 4 are accommodated in a main chamber 6, and the illuminating light from the illuminating system 4, shown in FIG. 2, is guided to the main body chamber (main body of the exposure apparatus) 6.

FIG. 2 also shows the locations of the impurity eliminating filters FL. In this apparatus, an air flow exists in the chamber 6 by the air conditioning conducted by the air conditioning system 7, so that the impurity eliminating filters FL may be positioned in the path of said air flow. The air conditioning system 7 is composed of a temperature regulator 8, a fan 9, a HEPA filter 10 etc. More specifically, an impurity eliminating filter FL1 is provided at an outlet A3 of the temperature regulator 8; a filter FL2 is provided at an outlet A4 of the fan 9; and a filter FL3 is provided in front, with respect to the direction of air flow, of the HEPA filter. At first the impurities are removed by the filter FL and then the foreign matters are removed by the HEPA filters, because the foreign matters eventually generated when the air passes the impurity eliminating filters FL can also be removed. An impurity eliminating filter FL may also be provided at an external air inlet of an unrepresented air compressor, in order to avoid impurities such as ions.

Furthermore, an impurity eliminating filter FL4 may be provided at the air inlet, which is most convenient for the maintenance work. Also in the illuminating system 4, in which the air flow from the temperature regulator 8 is not sufficiently supplied, there may be provided a HEPA filter 11 for avoiding the particle intrusion in combination with an impurity eliminating filter FL5, in a position where the air may flow in. It is more effective to provide a fan in front of the impurity eliminating filter FL5.

Figure 3:
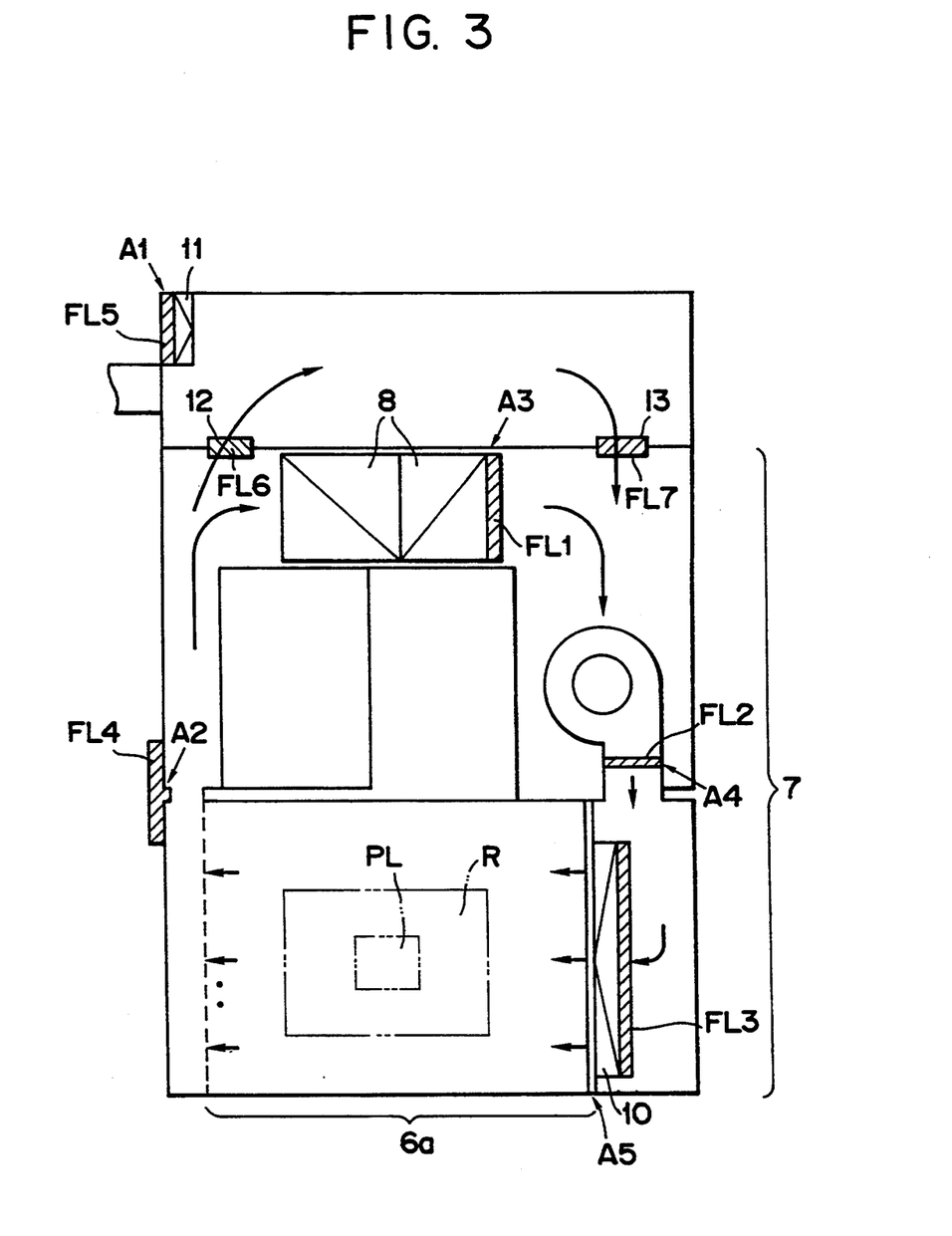
FIG. 3 is a view of the apparatus shown in FIG. 2, provided with an air inlet at the illuminating system.

Furthermore, there may be formed apertures 12, 13 on the partition between the illuminating system 4 and the chamber 6, in order to introduce the air flow from the chamber 6 into the illuminating system 4, and said apertures may be provided with impurity eliminating filters FL6, FL7 as shown in FIG. 3.

Such installation of the impurity eliminating filter at the air inlet of the illuminating system prevents new entry of harmful ions, thereby retarding the growth of haze in the optical system. Also by circulating the air flow in combination with the chamber 6, the amount of the harmful ions can be lowered to enhance the effect of preventing the haze in the optical system.

In the following there will be given a detailed explanation on the impurity eliminating filter FL.

An ion eliminating filter can be formed with ion exchange resin or ion exchange fibers, but the ion exchange fibers are preferred for gas processing, in consideration of a large surface area, a higher reaction speed and ease of working. The ion exchange fibers can be prepared, for example, by radiation graft polymerization from polypropylene fibers.

The ion exchange fibers can be classified into acidic cation exchange fibers and basic anion exchange fibers, which are selected according to the polarity of the target ions. The present embodiment employs both filters. $NH_4^+$, cations of amine etc. and basic gas can be absorbed by the former, while $SO_4^{2-}$, anions of $NO_x$ etc. and acidic gas can be absorbed by the latter. For example $NH_4^+$ can be +absorbed by about 90% or more even at a low concentration, by the neutralization reaction with strongly acidic cation exchange fibers. Also anions can be absorbed by the neutralization reaction with the basic anion exchange fibers. These ion exchange fibers are designed for the elimination of ionic impurities, and are not suitable for the elimination of organic substances.

Active charcoal filters are basically effective for most impurities (ions, gasses, organic silanol etc.), but the absorbability is generally higher for organic compounds with a larger molecular size, a larger intermolecular force, a lower solubility in water, or a lower polarity. It is therefore effective for the removal of the organic substances that cannot be eliminated by the ion exchange resin, for example organic silanes such as trimethyl silanol or HMD. The active charcoal filter has to be selected in consideration of the surface area, the average pore size, the shape of active charcoal and the particle generation, and there is preferred active charcoal of a large surface area and a pore size matching the molecular weight. The preferred examples, in consideration of the pressure loss, are Kuractive supplied by Kuraray Chemical Co., Ltd. and prepared by impregnating polyester-urethane fibers with active charcoal with a surface area of 500–3000 $m^2/g$ and a pore size of 9–30 Å, and active charcoal #1074 of Vapor Sorb supplied by Extraction System Inc. Active charcoal added with an acidic or weakly alkaline substance is also effective for the removal of ionic impurities. Such charcoal is commercialized by Kuraray Chemical as Kurasheet T or B, or by Vapor Sorb. as #1073K.

Similar to active charcoal, zeolite is effective for most impurities (ions, gasses, organic silanol etc.), but the pore size has to be selected according to the size of the impurity to be eliminated.

Such single filter of active charcoal or zeolite may be capable of eliminating the impurities to a certain extent. However, such absorbing material, of which pore size is determined in consideration of the molecular size of the target impurity, may not be effective for the elimination of the ionic substances. It is sometimes more effective to combine two filters, for eliminating the ionic substances by the ion exchange resin filter and eliminating the organic substances by the active charcoal or zeolite filter. Such composite two filters are particularly effective when plural impurities are present in mixture.

It is also possible to monitor the polarity and concentration of the ions by the aforementioned ion sensor 14, and to install a suitable ion eliminating filter FL according to the result of said sensing. Two filters are installed in superposed manner, if gasses of both polarities are present. Also filter installation in the air path reduces the contamination source in the exposure apparatus.

Furthermore, impurities and ions are generated by the influence of the supporting members or shield members for the optical elements in the apparatus, as will be explained later in more details. In order to suppress the generation of such harmful ions, it is conceivable to change the supporting and shielding members to a material of less ion generation, and to effect nitrogen flow for avoiding the influence of water and $O_2$. However, the nitrogen flow in the entire chamber requires a considerable amount of nitrogen gas, leading to the possibility of suffocation at the wafer handling, so that nitrogen replacement may be limited to the illumination system where the UV light intensity is relatively high.

The detailed investigation has revealed that the haze is mostly induced by certain specified impurities such as $NH_4^+$, $SO_4^{2-}$, HMDS and trimethyl silanol contained in the atmosphere clean room in which the exposure apparatus is installed. It is therefore possible to prevent the contamination of the illuminating system of the exposure apparatus, merely by replacing the interior of the illuminating system with gas different from the atmosphere of the clean room, such as dry air or inert gas such as He or Ar or by flowing such gas in the illuminating system, instead of the aforementioned nitrogen flow.

Also as the basic gas such as amine in the chamber is reduced by the impurity eliminating filter, such as the ion exchange fiber filter, and the air laminar flow, the reaction between such amine gas and the exposed portion of the chemical amplification photoresist on the wafer at the exposure operation is also reduced. Thus there can be prevented the surface insolubilization and the T-shaped profile, which have been the drawbacks in the positive-working chemical amplification photoresists.

The above-explained installation of the ion eliminating filters FL at the external air inlets, and the inlet and outlet of the air conditioning device reduces the substances (ions etc.) photochemically deposited in the UV irradiated portion of the optical materials. Consequently the exposure operation can be conducted without haze generation on the optical materials.

Also the haze in the apparatus (particularly in the illuminating system) can be prevented by constructing the illuminating system as a closed system, except for an aperture installed with the eliminating filter, thereby preventing the intrusion of the contaminated air of the clean room into the system.

Also the use of the impurity eliminating filters FL eliminates the basic gas, thereby resolving the drawbacks of the positive-working chemical amplification photoresists.

However haze is generated on the optical materials if the impurity eliminating filters FL are smeared and lose the ability for eliminating the impurities such as ions. It is therefore conceivable to monitor the illumination intensity periodically with said illumination intensity monitor 13 and to replace the filters FL in case the loss of the illumination intensity exceeds a tolerance (selected smaller than the actual tolerance for the illumination intensity loss). The impurity eliminating filters FL may also be replaced periodically. The timing of replacement may be determined in advance based on the result of detection of the illumination intensity loss, measured by the illumination intensity monitor, or empirically.

It is also possible to detect the concentrations of ions and basic gas with the ion monitor 14, and to control the apparatus so as to effect the exposure operation after said concentrations are reduced to tolerable levels. It is furthermore possible to detect the concentrations of ions and basic gas during the exposure operation, and, if tolerable levels are exceeded, to interrupt the exposure operation and to replace the ion eliminating filters FL.

The light source 1 is not limited to an excimer laser. There may be employed a copper vapor laser or a YAG laser, and a harmonic wave thereof for exposure.

With respect to organic silane impurities the timing of replacement of filters may be determined by periodically analyzing the air components with gas chromatograph or gas chromatograph-mass spectroscopy, on the air in the exposure apparatus absorbed in a sample column.

The light source 1 is not limited to an excimer laser. There may be employed a copper vapor laser, a YAG laser or a Ti-sapphire laser, and a harmonic wave thereof for exposure. The present invention is applicable also to an exposure apparatus utilizing an ultraviolet lamp.

In the following there will be explained a second embodiment of the present invention.

Figure 5:
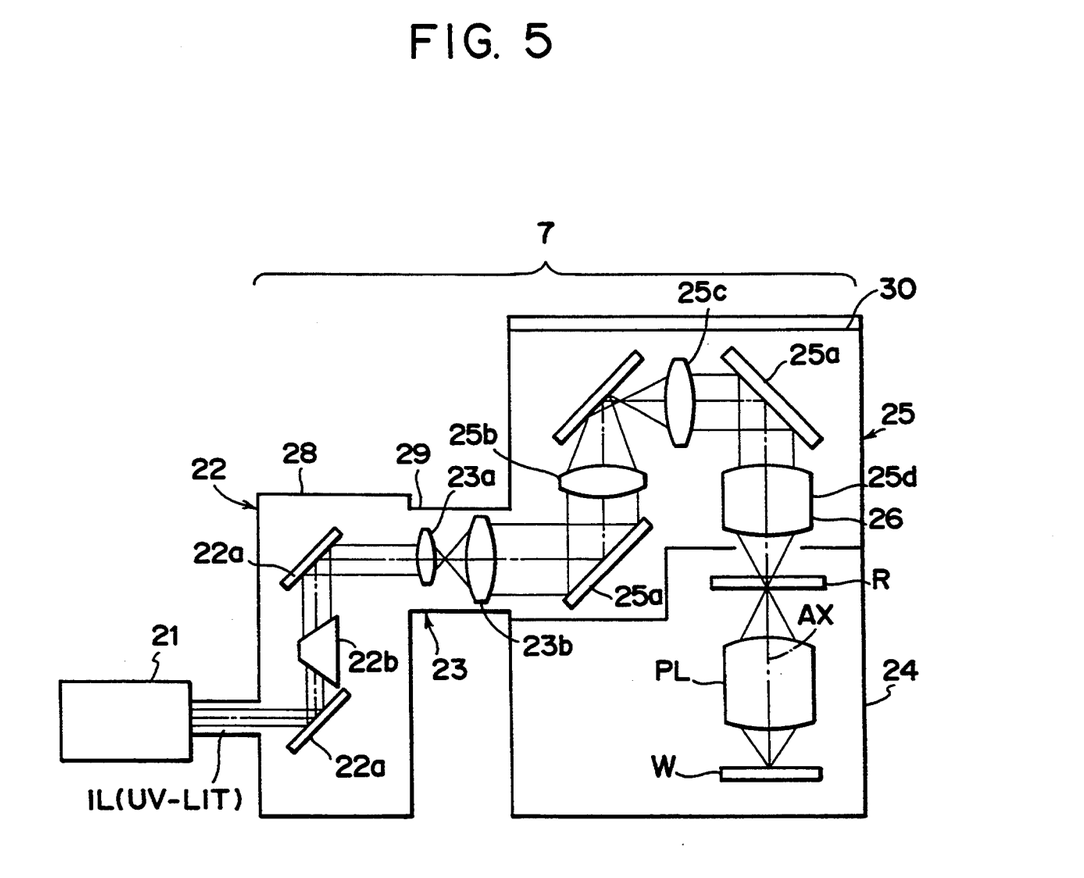
FIG. 5 is a schematic view of an exposure apparatus constituting a second embodiment of the present invention.

FIG. 5 is a schematic view of a laser exposure apparatus in which the second embodiment of the present invention is applicable. An illuminating light beam (UV light) IL emitted from an excimer laser light source 21 of a wavelength for example of 248 or 193 nm is shaped into required shape and size in a beam matching unit 22, composed of a mirror 22a and a beam shaping lens group 22b. Thus shaped illuminating light IL is guided, through a relay lens system 23 (23a, 23b), to a system 25 for obtaining a uniform illumination intensity. The system 25 is composed of a mirror 25a, a lens 25b, a lens system 25c including an optical integrator such as fly's eye lenses and relay lenses, and a condenser lens 25d, and, by means of said lens system 25c and condenser lens 25d, the illuminating light IL provides a substantially uniform illumination intensity on a reticle R. The illuminating light IL emerging from the reticle R reaches a wafer W through a projection optical system PL. The reticle R and wafer W are optically conjugate with respect to the projection optical system PL, whereby the image of a reticle pattern provided on the reticle R is focused on the wafer W by said projection optical system PL. The wafer W is placed on an unrepresented stage, and is rendered movable in the direction of the optical axis AX, and in a plane perpendicular to the optical axis AX.

The beam matching unit 22 is provided in a shield unit 28, and the optical systems 22a, 22b of said beam matching unit are fixed to said shield unit 28. The relay lens system 23 is provided in a shield unit 29, and the optical systems 23a, 23b in the relay lens system 23 are fixed on said shield unit 29. Also the uniform illumination intensity system 25 is provided in a shield unit 30, and the optical systems 25a–25d are fixed on said shield unit 30. The shield unit 28 is to shield the light deviated from the light path of the beam matching unit 22. Such deviated light includes the light reflected by the coating on the lens surface, the light reflected by the members supporting the lenses 22a, 22b in the beam matching unit 22, and the light eclipsed by the lenses 22a, 22b. Similarly the shield units 29, 30 are to intercept the light deviated from the light paths of the relay lens system 23 and the uniform illumination intensity system 25. Such deviated light includes the light reflected by the coating on the lens surfaces, or by the members (for example 32 in FIG. 7) supporting the lenses (23a, 23b, 25a–25d) and the light eclipsed by the lenses (23a, 23b, 25a–25d).

The uniform illumination intensity system 25, reticle R, projection optical system PL and wafer W are accommodated in a chamber 24. The beam matching unit 22, relay lens 23 and uniform illumination intensity system 25 will be collectively called an illumination optical system 27.

In the following there will be given an explanation on the cause of smear on the optical materials, with reference to FIG. 6, also in consideration of the influence of UV light on the smear by the impurities present in the apparatus and on the impurities generated within the apparatus.

Figure 6:
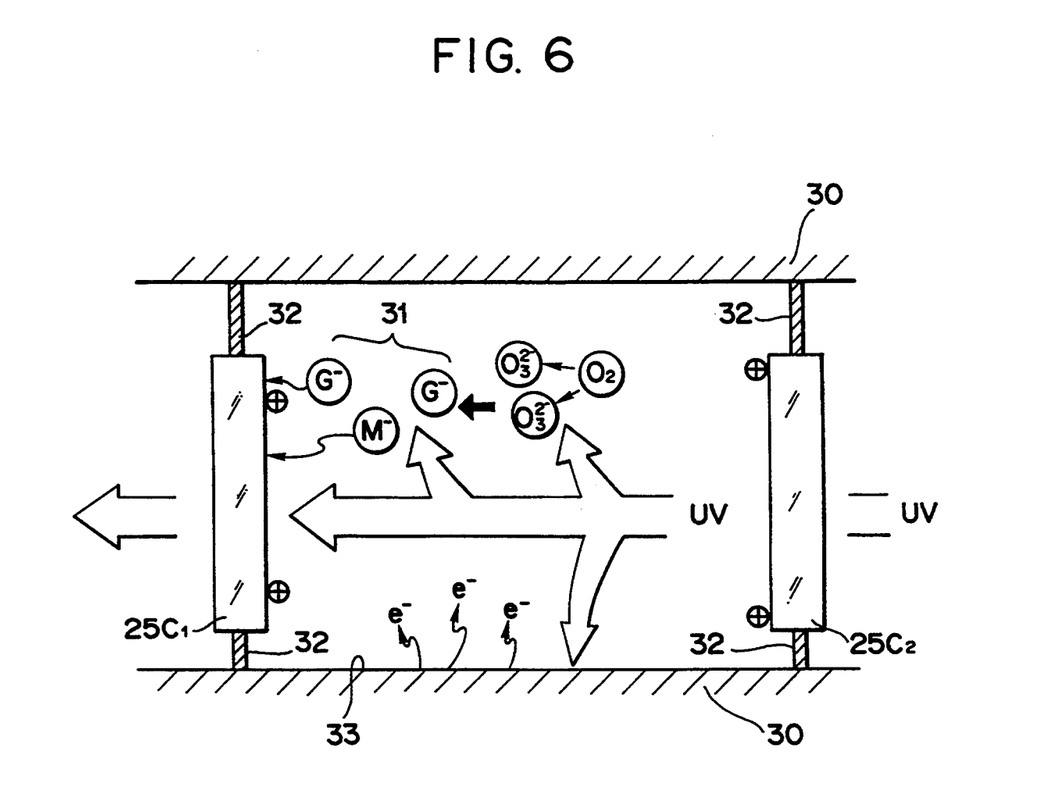
FIG. 6 is a view showing the generation of smear of the optical member in a part of the apparatus shown in FIG. 5.

FIG. 6 is a partial view of the optical system in the illumination optical system 27 shown in FIG. 5, specifically showing the lens 25c in the system 25. In FIG. 6, lenses $25c_1$, $25c_2$ are a part of the lens 25c, and are fixed by a support member 32 to the shield unit 30.

The smear on the optical materials is ascribable to several parameters as explained in the following items (1) to (4):

(1) The surface (quartz or evaporated film) of the optical materials $25c_1$, $25c_2$ is charged by the UV light irradiation;

(2) Floating matters 31 such as particles M in the air and gas G are decomposed and ionized by the UV light, and deposited onto the surface of the optical materials $25c_1$, $25c_2$. Such decomposition may occur by (1) direct decomposition by the UV light, or by (2) decomposition and ionization of the floating matters 31 such as the particles M and gas G by ozone generated from oxygen present in the air or oxygen generated from other causes;

(3) Scattered or direct light irradiates the support member 32 or the shield plate 30, and, if they are made of metal, electrons e are liberated from the metal surface 33 by the photoelectric effect, thereby ionizing the particles M and gas G in the vicinity of said metal surface;

(4) Scattered or direct light irradiates the support member 32 or the shield plate 30 and decomposes the material of said member or plate or a protective film thereon, the decomposed substance being scattered and deposited on the optical materials $25c_1$, $25c_2$.

In practice the above-mentioned factors are presumably present in composite form, but, in consideration of a fact that the smear is particularly conspicuous in the light irradiated area, or namely that the light irradiated area has a certain factor absorbing the smear, the principal cause is presumably the deposition of ions of particles and gas, mentioned in (1) to (3), onto the optical members.

The quartz surface or the coating film of the optical material is generally represented as $SiO_x$ exhibiting different properties in the oxygen sufficient state and in the oxygen deficient state. In the oxygen sufficient state, under the UV light irradiation, crystallization proceeds and excessive oxygen molecules are released to the outside. In this case the surface of the optical member is charged positively. In the oxygen deficient state, the surface is charged negatively as the bonds of the network structure become superfluous. In practice, the surface is usually charged positively. With such positive surface charging under the UV light irradiation, oxygen is liberated in the form of molecules or atoms, and may be ionized into ozone $O_3^-$. Also oxygen in the air is changed into ozone by UV irradiation. Ozone gas is extremely reactive by UV irradiation. Ozone gas is extremely reactive with various substances, thus decomposing and ionizing the floating substances 31 such as particles M and gas G in the atmosphere. The floating matters 31 such as particles M and gas G may also be directly decomposed and ionized by the UV light. Furthermore, certain ions ($NH_4^+$, $SO_4^{2-}$, $OH^-$ etc.) are often present in the atmosphere. Also the ionization of the molecules by the photoelectric effect of the metal surface may be affected for example by the convection in the atmosphere or by the pressure reduction. Thus the smear on the surface of the optical materials are caused by absorption of various substances, charged positively or negatively under the influence of the UV light irradiation.

If such ionized particles are the principal cause of the smear on the optical materials, means for reducing the deposition of such ionized particles onto the optical materials will reduce the down time of the apparatus, required for cleaning of the optical materials.

Figure 7:
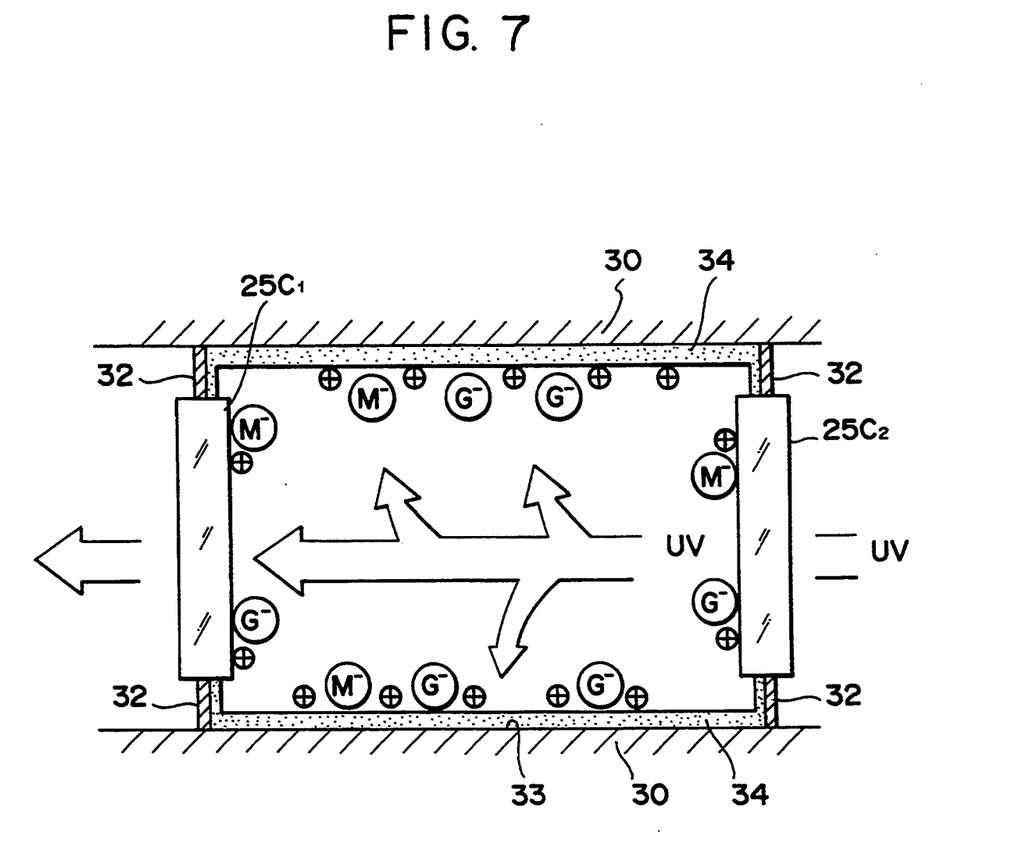
FIG. 7 is a view showing a dielectric member provided on the wall of a shield unit, in a part of the apparatus shown in FIG. 5.

Thus the scattering from the metal surface (metal or decomposed protective film) or the ionization of the particles by the electrons liberated by the photoelectric effect can be prevented by coating the metal surface of the wall 33 of the shield unit 30 or the supporting member 32 with a dielectric member 34, as shown in FIG. 7. In FIG. 7 the wall 33 of the shield unit 30 is covered by the dielectric member 34. Such coating on the metal surface avoids ionization of particles, resulting front UV irradiation of the metal surface. Also the dielectric material is charged by the UV light irradiation, thus absorbing the ionized particles onto the wall and reducing the smear on the optical materials.

Examples of such dielectric material include a material with a high UV transmittance, such as quartz; glass with UV absorption, such as BK-7 or pyrex; and plastic materials such as acrylic resin, polyethylene terephthalate or polyimide. In particular, glass such as BK-7 or pyrex, or plastics such as acrylic resin are capable of absorbing the UV light and are more easily chargeable than the quartz used as the optical material. For this reason the ionized particles are more easily absorbed on the wall, and the smear of the optical materials is further reduced. In order to prevent scattering by the UV irradiation, the dielectric member 34 is composed of a material resistant to the UV light.

Figure 8:
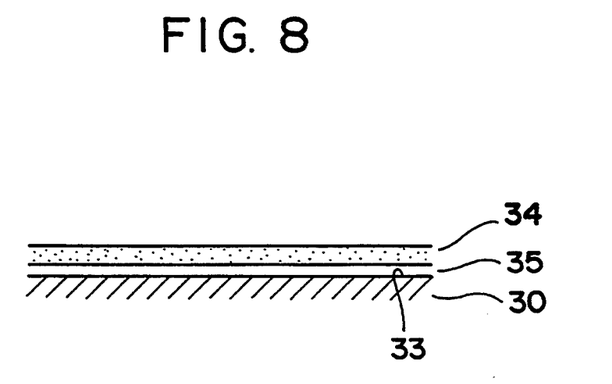
FIG. 8 is a view showing the mode of adhesion of the dielectric member in the second embodiment of the present invention.

The dielectric member 34 can be applied to the metal surface of the shield unit 30, for example by film formation or by adhesion. In the latter case the dielectric member 34 is pasted, as shown in FIG. 8, with an adhesive material 35 onto the surface of the metal 33. If the dielectric member is highly transmissive to the UV light (for example quartz), the adhesive material may be deteriorated depending on its UV resistance. Nevertheless, there will not be contamination of the atmosphere, as long as the peripheral part is not peeled off.

Figure 9:
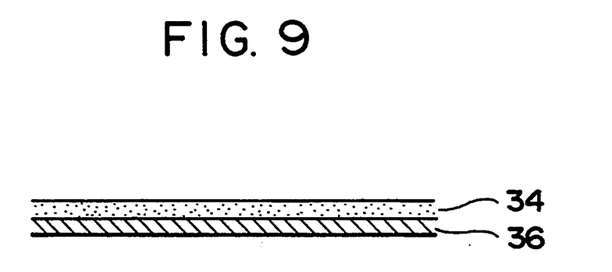
FIG. 9 is a view showing a light absorbing member, provided on the dielectric member, in the second embodiment of the present invention.

In case the dielectric member 34 is made of an easily workable plastic material or the like, it may be fixed to the metal by screwing or fitting, instead of adhesion. Also if such plastic material does not cause light leakage by sufficient UV absorption and has enough mechanical strength, the shield unit 30 may be composed of such plastic material only, dispensing with the metal plate. Even in case the UV absorption is insufficient, there may be applied an absorbing member 36 for absorbing the UV light on the outside (opposite to the space in which the UV light passes, across the dielectric material), as shown in FIG. 9. The absorbing member 36 may be formed as a sheet.

The dielectric film 34 may also be formed by evaporation for example by ion beam sputtering, or by coating of a material such as SOG (spin-on glass) followed by sintering. For example, a film of $SiO_2$, $TiO_2$ or $Al_2O_3$ can be obtained by immersion or spin coating of MOF (coat-baking type metal oxidizing zone forming agent) supplied by Tokyo Ohka Kogyo Co., Ltd. on a metal plate, followed by sintering at about 500 ° C. The film thickness can be regulated by the viscosity and concentration, but a thickness of about 1000 Å is preferred because cracks are generated at a larger thickness. Also it is necessary to apply seals at the coating on the screw holes for assembling the shield unit and to remove said seals after the coating is dried, in order to prevent clogging of such screw holes with the coating material. Furthermore the dielectric member 34 may be composed of an aluminum foil coated with a $SiO_2$-based ceramic material, such as the ceramic sheet supplied by Dipsole Inc. The sheet, being easily handled, can be easily mounted on the wall 33 of the shield unit 30. Also the sheet can achieve absorption by surface coarseness, in addition to the ion absorption by the surfacial dielectric member.

In the following there will be explained a third embodiment of the present invention, wherein components equivalent to those in the second embodiment will be represented by the same symbols. This embodiment is to enhance the effect of smear prevention for the optical materials, by combining nitrogen blow or the like with the above-mentioned provision of the dielectric member on the wall 33 of the shield unit 30.

Oxygen in the air is converted by the UV irradiation into radical oxygen or ozone, which accelerates decomposition and ionization of particles and gas. Consequently, the ozone generation can be suppressed by nitrogen replacement of the atmosphere. Such reduced ozone generation decreases the ionized particles resulting from such ozone, and also prevents the deterioration in the UV resistance and in the optical performance of the glass and its coating, resulting from the influence of ozone.

Figure 10:
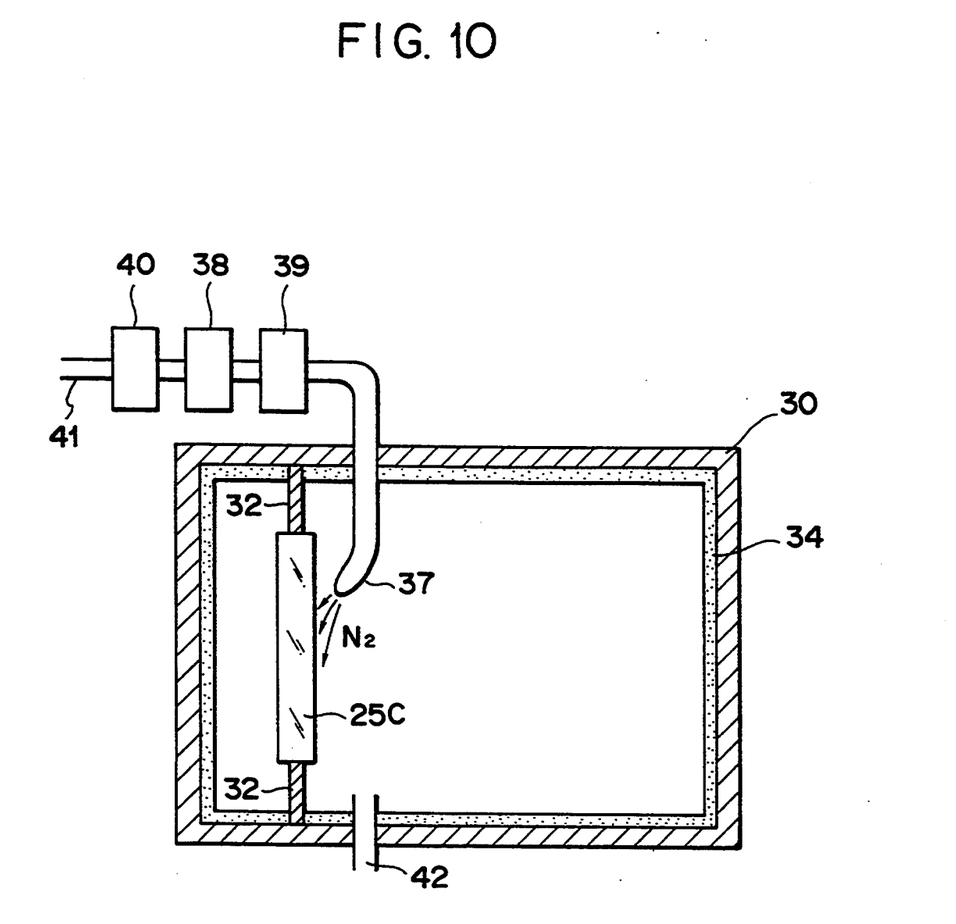
FIG. 10 is a view showing nitrogen blow in a third embodiment of the present invention.

FIG. 10 shows the mode of nitrogen blow of the optical elements in the shield unit 30, wherein the nitrogen gas emitted from a nozzle 37 is discharged, after the necessary blowing, from an outlet 42. In FIG. 10, the inlet and outlet for the UV light are not illustrated. As shown in FIG. 10, the nozzle 37 is directed to the surface of individual optical element in the lens 25c of the system 25 and nitrogen is blown considerably strongly, in order to prevent the deposition of the ionized particles. Such blowing may be applied to an area of the optical surface, where the UV irradiation density exceeds a certain level. In order to avoid intrusion of the particles or gas that may contribute to the smear of the optical elements, an oil mist filter 38 and a particle absorbing filter 39 are provided at the entrance of a piping 41. It is also effective to provide the entrance of the piping 41 (at the entrance side of the oil mist filter) with an ion eliminating filter 40 (electrostatic filter), in order to prevent intrusion of already ionized particles or gas. Also in order to avoid particles, the piping 41 is changed from a plastic material to stainless steel pipe. Such nitrogen gas blow onto the surface of the optical materials can prevent particle deposition. Intrusion of the particles or gas together with the nitrogen gas introduction can be prevented by the use of various filters.

If the wall surface is contaminated by the absorption of the ionized particles and causes recontamination of the atmosphere by the de-sorption of such particles, the wall surface is to be cleaned by replacement or cleaning. If the dielectric member is attached by adhesion or by film formation on the metal surface, the metal plate can be replaced or cleaned. If a plastic material is attached for example with screws, said plastic material alone can be detached and replaced or cleaned. The cleaning can be acheived by wiping, or by decomposition or sublimation under heating. The wall surface inevitably becomes gradually smeared, but such smear is not a serious problem as it is not related to the imaging performance. Also such replacement of the metal or plastic plate does not require the adjustment of the optical axis etc.

The location of the dielectric member 34 is not necessarily limited to the shield unit 30 in the uniform illumination intensity system 25. It may also be provided in the shield unit 29 of the relay lens 23, or on the wall surface 33 of the shield unit 28 of the beam matching unit 22, or the wall surface of the chamber 24, or these wall surfaces may be entirely covered with the dielectric member.

The nitrogen blow shown in FIG. 10 is explained in the system 25, just for the convenience of explanation, but it may also be conducted in the relay lens system 23, the beam matching unit 22, or the chamber 24, and it is more effective if the nitrogen blow is conducted in all these locations.

Also for a large area for which the replacement work is difficult to conduct, such as the wall surface of the chamber 24, there may be prepared an internal shield box with said dielectric material or with a metal with said dielectric material attached thereon, and such internal shield box may be entirely replaced.

The present invention can provide similar effects also on an apparatus for removing the photosensitive material from the photosensitive substrate, or a working apparatus for working an object with the UV light irradiation.

Also the light source is not limited to a laser but can be any light source emitting the light of ultraviolet region.

Furthermore, the air conditioning mechanism of the foregoing first embodiment and the impurity eliminating filters FL may be applied to the apparatus of the second embodiment. It is thus rendered possible to eliminate the impurities (ions, gasses, organic silanes etc.) giving rise to the smear by means of the impurity eliminating filters, and also to remove the ionic substances which still remain or which are generated by the UV light irradiation, by absorption on the dielectric member 34. Thus the combination of the impurity eliminating filters and the dielectric member 34 enhances the effect of preventing the smear on the optical members.

A further enhanced effect can be obtained by combining the combination of the impurity eliminating filters and the dielectric member 34, with the nitrogen blow in the third embodiment.

The foregoing embodiments have been explained by the exposure apparatus for forming the image of a mask pattern on a photosensitive substrate utilizing the light of ultraviolet region, but the present invention is not limited to such embodiments. For example, the present invention is likewise applicable to an apparatus for partially removing the photosensitive material on the photosensitive substrate by means of the UV light, as disclosed in the Japanese Patent Laid-Open Application No. 62-252136. In such exposure apparatus utilizing the UV light, quartz, having sufficient transmittance and resistance to the UV light from the light source, is most frequently used as the material constituting the optical system. Also the UV light used in such ultraviolet exposure apparatus is hazardous to the human body so that such apparatus is so constructed that the UV light does not leak to the outside. More specifically, the optical systems in the ultraviolet exposure apparatus are accommodated in shield units, having metal walls composed for example of aluminum subjected to almite treatment. Such shield units prevent the UV light, deviated from the paths of the optical systems, from leaking to the exterior of the exposure apparatus. Consequently, the use of the impurity eliminating filters as in the first embodiment can eliminate the impurities (ions, gasses, organic silanes etc.) present in the atmosphere, thereby preventing haze generation in the optical system. Also the use of the dielectric member in the shield units, as in the foregoing second embodiment, can eliminate the ionic substances which remain in the apparatus or are generated by the UV irradiation, thereby preventing the haze formation in the optical systems.

What is claimed is:

1. An exposure apparatus comprising:
   a) a light source emitting light of the ultraviolet region;
   b) an illuminating system for introducing the light from said light source into a mask bearing a predetermined pattern;
   c) an exposure unit for forming an image of said mask pattern on a photosensitive substrate;
   d) a chamber accommodating said light source, said illuminating system and said exposure unit; and
   e) impurity eliminating means for eliminating at least an organic impurity that induces a photochemical reaction with said light of the ultraviolet region and for eliminating at least one ionic impurity by a neutralization reaction.

2. An exposure apparatus according to claim 1, wherein said impurity eliminating means includes an organic substance eliminating filter, capable of eliminating organic substances.

3. An exposure apparatus according to claim 2, wherein said organic substance eliminating filter is a resin filter containing active carbon.

4. An exposure apparatus according to claim 2, wherein said organic substance eliminating filter is a filter containing zeolite.

5. An exposure apparatus according to claim 1, wherein said impurity eliminating means includes an ion eliminating filter for eliminating ions, and an organic substance eliminating filter for eliminating organic substances.

6. An exposure apparatus according to claim 5, wherein said organic substance eliminating filter is a resin filter containing active carbon.

7. An exposure apparatus according to claim 5, wherein said organic substance eliminating filter is a filter containing zeolite.

8. An exposure apparatus according to claim 1, further comprising air conditioning means for effecting air conditioning in said chamber by circulating gas therein; wherein said impurity eliminating means is provided at least one of a gas inlet of said air conditioning means, a gas outlet of said air conditioning means, and an air inlet of said chamber.

9. An exposure apparatus according to claim 8, wherein said air inlet of said chamber is an air inlet of said illuminating system.

10. An exposure apparatus according to claim 8, further comprising a foreign matter eliminating filter for eliminating foreign matters in said chamber, provided at least at one of an air inlet of said chamber, a gas inlet of said air conditioning means and a gas outlet of said air conditioning means,
    wherein said impurity eliminating means is positioned in front of said foreign matter eliminating filter with respect to the direction of air flow passing said filter.

11. An exposure apparatus according to claim 8, wherein said air inlet of said chamber is an external air inlet of said chamber.

12. An exposure apparatus according to claim 1, wherein said photosensitive substrate is coated with a photosensitive material of chemical amplification type.

13. An exposure apparatus according to claim 1, wherein said apparatus further comprises:
    an ion sensor for detecting the concentration of said ionic substance; and
    a control unit for effecting an exposure operation when the detected value of said ion sensor does not exceed a tolerance value.

14. An exposure apparatus according to claim 1, wherein said impurity eliminating means includes an ion eliminating filter that eliminates acidic ions and basic ions.

15. An exposure apparatus according to claim 1, wherein said impurity eliminating means includes an ion eliminating filter comprising active carbon and at least one of an acidic substance and an alkaline substance.

16. An exposure apparatus according to claim 1, wherein said impurity eliminating means includes an ion eliminating filter comprising ion exchange fibers.

17. An exposure apparatus comprising:
    a) a light source emitting light of the ultraviolet region;
    b) an illuminating system for introducing the light from said light source into a mask bearing a predetermined pattern;
    c) an exposure unit provided with an imaging optical system for forming an image of said mask pattern on a photosensitive substrate;
    d) a shield unit for shielding the optical path of least one of said illuminating optical system and said imaging optical system from the ambiance; and
    e) a dielectric member provided on said shield unit and adapted to absorb an ionic impurity that induces a photochemical reaction with said light of the ultraviolet region and that causes deposition on at least one of said illuminating optical system and said imaging optical system.

18. An exposure apparatus according to claim 17, wherein said illuminating system includes an optical member for guiding the light from said light source to a predetermined direction, and said dielectric member is composed of a material which is more easily chargeable than said optical member.

19. An exposure apparatus according to claim 18, wherein said dielectric member is composed of a plastic material.

20. An exposure apparatus according to claim 19, wherein said shield unit is composed of a plastic material having a substantial absorbance to said light of the ultraviolet region.

21. An exposure apparatus comprising:
a) a light source emitting light of the ultraviolet region;
b) an illuminating system having an illuminating optical system for introducing the light from said light source into a mask bearing a predetermined pattern;
c) an exposure unit having an imaging optical system for forming an image of said mask pattern on a photosensitive substrate;
d) a chamber accommodating said light source, said illuminating system and said exposure unit;
e) an impurity eliminating filter for eliminating at least an organic impurity that induces a photochemical reaction with said light of the ultraviolet region;
f) a shield unit for shielding the optical path of at least one of said illuminating optical system and said imaging optical system from the ambiance; and
g) a dielectric member provided in said shield unit and adapted to absorb an ionic impurity that induces a photochemical reaction with said light of the ultraviolet region and that causes deposition on at least one of said illuminating optical system and said imaging optical system.

22. An exposure apparatus comprising:
a) a light source emitting light of the ultraviolet region;
b) an illuminating system for introducing the light from said light source into a mask bearing a predetermined pattern;
c) an exposure unit for forming an image of said mask pattern on a photosensitive substrate; and
d) impurity eliminating means including an eliminating filter that eliminates acidic ions and basic ions by a neutralization reaction.

* * * * *